US007002430B2

(12) United States Patent
Benham et al.

(10) Patent No.: US 7,002,430 B2
(45) Date of Patent: Feb. 21, 2006

(54) COMPACT NON-LINEAR GEOMETRY ELECTROMAGNETIC COUPLER FOR USE WITH DIGITAL TRANSMISSION SYSTEMS

(75) Inventors: John R. Benham, Hopkinton, MA (US); John L. Critchlow, Northborough, MA (US); Tao Liang, Westford, MA (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 10/449,215

(22) Filed: May 30, 2003

(65) Prior Publication Data

US 2004/0239438 A1 Dec. 2, 2004

(51) Int. Cl.
*H01P 5/18* (2006.01)
(52) U.S. Cl. ...................... 333/24 R; 333/116; 710/100
(58) Field of Classification Search ................ 333/109, 333/116, 24 R; 710/100
See application file for complete search history.

(56) References Cited

U.S. PATENT DOCUMENTS

| | | | |
|---|---|---|---|
| 3,164,790 A * | 1/1965 | Oh | 333/116 |
| 5,625,169 A * | 4/1997 | Tanaka | 174/250 |
| 6,449,308 B1 | 9/2002 | Knight, Jr. et al. | |
| 6,498,305 B1 * | 12/2002 | Marketkar et al. | 174/250 |
| 6,611,181 B1 * | 8/2003 | Marketkar et al. | 333/24 R |
| 6,625,682 B1 * | 9/2003 | Simon et al. | 710/305 |
| 2001/0024888 A1 | 9/2001 | Marketkar et al. | |
| 2001/0053187 A1 | 12/2001 | Simon et al. | |

* cited by examiner

*Primary Examiner*—Benny Lee
(74) *Attorney, Agent, or Firm*—Blakely, Sokoloff, Taylor & Zafman LLP

(57) ABSTRACT

A compact electromagnetic coupler for use with digital transmission system is described. In one embodiment, the apparatus includes a first transmission structure, including a portion having a geometry. A second transmission structure having the geometry and positioned proximate the portion of the first transmission line structure having the geometry to form a compact electromagnetic coupler with the first transmission structure a geometry of the electromagnetic coupler to enable placement within a footprint of a standard card connector. The compact electromagnetic coupler so formed enables reconstruction of the logical state and timing of a signal transmitted along the first transmission structure.

30 Claims, 9 Drawing Sheets

COMPUTER SYSTEM 600

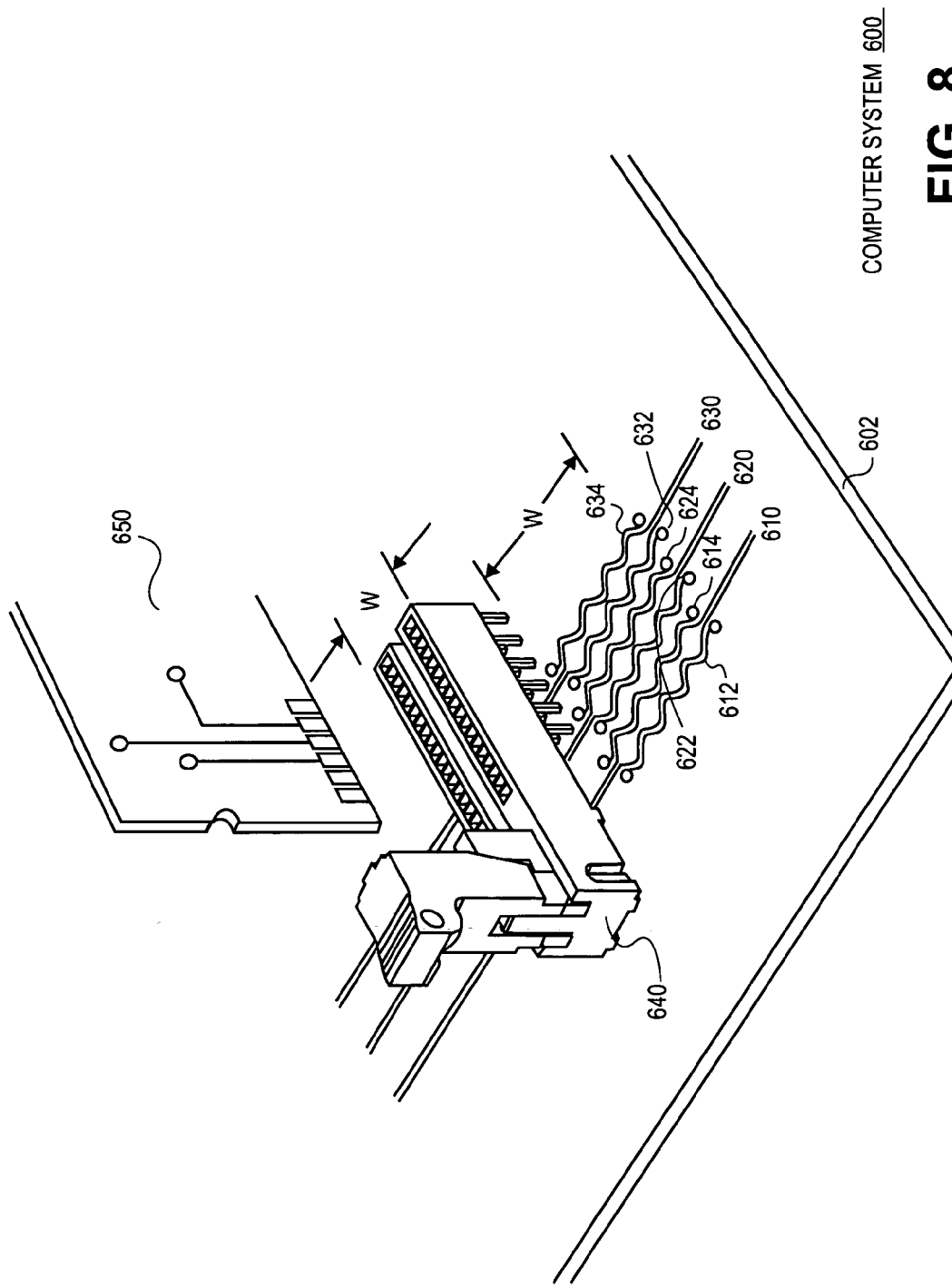

COMPACT NON-LINEAR GEOMETRY ELECTROMAGNETIC COUPLER FOR USE WITH DIGITAL TRANSMISSION SYSTEMS

FIELD OF THE INVENTION

One or more embodiments of the invention relate generally to the field of electromagnetic coupling devices. More particularly, one or more of the embodiments of the invention relates to a compact electromagnetic coupler for use with digital transmission systems.

BACKGROUND OF THE INVENTION

Communication between devices within a computer system is typically performed using one or more buses to interconnect the devices. These buses may be dedicated buses coupling two devices or non-dedicated buses that are multiplexed by a number of units and devices (e.g., bus agents). Moreover, buses within a computer system may be dedicated to transferring a specific path of information. For example, the X86 microprocessor architecture developed by Intel Corporation of Santa Clara, Calif. includes a three bus system with address, data and control buses for respectively transferring data, address and control signals.

A vast amount of research and system architecture design is directed to increasing data throughput within computer systems. For many years, a popular method of connecting digital systems was the multi-drop bus. In a multi-drop bus, several modules, usually PC boards, connect to a bus via transceivers in a wiring stub. At any given point in time, one module is authorized to transmit and the other module listens. From an abstract point of view, a multi-drop bus configuration is convenient since the configuration permits any module to communicate with any other module.

Unfortunately, multi-drop buses are rarely used today in high performance digital systems due to the fact that the stubs severely limit the bandwidth at which the bus can operate. In other words, within high performance systems which operate at high frequency clock rates, signals along the bus line are continuously degraded by the presence of each stub connection. As a result, transmission line reflections and consequent inter-symbol interference often occurs when operating at high frequencies. Accordingly, high performance digital systems generally utilize either point-to-point connections for devices in order to avoid the limitations inherent in multi-drop buses.

As a result, the number of system cards that may be attached to the high performance digital system is drastically reduced and generally limited to the attachment of only one card, such as for example, a memory card. The attachment card is generally referred to by those known in the art as a daughter card. In other words, current systems are unable to provide connections for inserting available daughter cards to increasingly high speed mother board memory buses without compromising system performance. As a result, providing daughter cards within conventional systems requires a point-to-point connection for each attached daughter card, including for example, memory cards, I/O cards, video cards and the like.

BRIEF DESCRIPTION OF THE DRAWINGS

The various embodiments of the present invention are illustrated by way of example, and not by way of limitation, in the figures of the accompanying drawings and in which:

FIG. 8 is a block diagram illustrating a computer system including meander line coupler, in accordance with one embodiment of the invention.

DETAILED DESCRIPTION OF THE INVENTION

A compact electromagnetic coupler for use with digital transmission system is described. In one embodiment, the compact electromagnetic coupler includes a first transmission structure, including a portion having a geometry. A second transmission structure having the geometry is positioned proximate the portion of the first transmission line structure having the geometry to form an electromagnetic coupler with the first transmission line structure to enable the reconstruction of a signal transmitted along the first transmission structure.

In the following description, numerous specific details such as logic implementations, sizes and names of signals and buses, types and interrelationships of system components, and logic partitioning/integration choices are set forth in order to provide a more thorough understanding. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement appropriate logic circuits without undue experimentation.

Electromagnetic coupling devices enable energy to be transferred between components of a system via interacting electric and magnetic fields. These interactions are quantified using coupling coefficients. The capacitive coupling coefficient ($K_C$) is the ratio of the per unit length coupling capacitance ($C_M$) to the geometric mean of the per unit length capacitance of the two coupled lines ($C_L$). Similarly, the inductive coupling coefficient ($K_L$) is the ratio of the per unit length mutual inductance ($L_M$) to the geometric mean of the per unit length inductance of the two coupled lines ($L_L$).

As known to those skilled in the art, any parallel coupled pair of transmission lines yield contradirectional traveling waves, often referred to by those skilled in the art as crosstalk. In other words, crosstalk is the transfer of information from one signal that may or may not interfere with another signal.

TABLE 1

| $K_C$ Capacitive coupling coefficient | $K_L$ Inductive coupling coefficient | Pulse $V_{out}$ (peak) in volts | Pulse width ($V_{out}/2$) in sec | Voltage x time product (volt sec) | Directivity ($V_{near}/V_{far}$) |
|---|---|---|---|---|---|
| 0.093522 | 0.178 | 0.1165 | 9.68E-11 | 1.09E-11 | 2.08 |

Figure 1A:
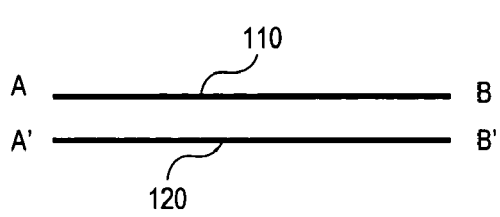
FIG. 1A is a block diagram illustrating a conventional microstrip, as known in the art.

FIG. 1A is a block diagram illustrating a linear edge coupled microstrip 100, as known in the art. The width of the coupled pulse for this structure 100 is given by twice the ratio of the length of the coupler to the velocity of propagation for the line length (A–B) 110 ((A'–B') 120). The coupled microstrip line widths (W) are 5 thousandths of an inch (5 mils) with a 5 mil interline separation (S), a line thickness (T) of 2.1 mils, a line length A–B of 196 mils and a dielectric 130 that is 4 mils thick (H) with a dielectric constant of 4.3 and ground plane 140. Based on these parameters, microstrip 100 yields the pulse output data as provided in Table 1 assuming a 1 volt pulse with a 2.90 second period and 0.1 nanosecond rise time pulse as the input stimulus.

TABLE 2

| $K_C$ Capacitive coupling coefficient | $K_L$ Inductive coupling coefficient | Pulse $V_{out}$ (peak) in volts | Pulse width ($V_{out}/2$) in sec | Voltage x time product (volt sec) | Directivity ($V_{near}/V_{far}$) |
|---|---|---|---|---|---|
| 0.198838 | 0.183626 | 0.2114 | 1.41e-10 | 2.57E-11 | 6.67 |

Figure 1A:
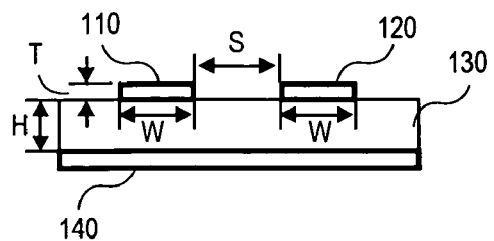
Figure 1B:
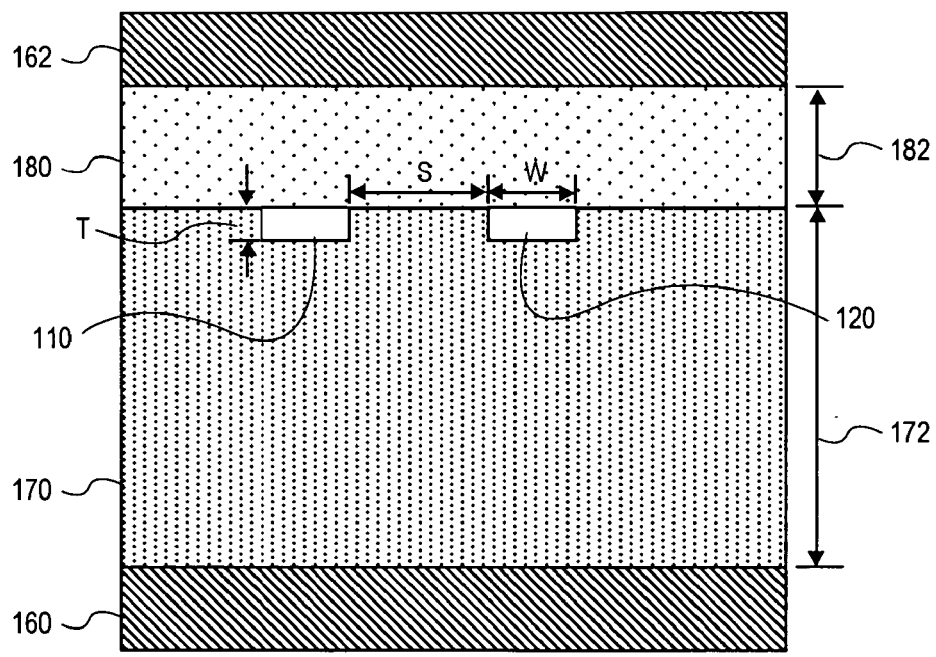
FIG. 1B is a block diagram illustrating a conventional stripline, as known in the art.

FIG. 1B illustrates the transmission structure of FIG. 1A implemented in an asymmetric stripline system 150 (FIG. 1B) with stripline dielectric 180 having dielectric thickness 182 of 4.3 mils, dielectric 170 having dielectric thickness 172 of 36 mils plus 4.3 mils (=40.3 mils), ground plane 160. and return plane 162. Representatively, if the line width (W) line thickness (T) and line separation (S) of conductor (A–B) 110 and conductor (A'–B') 120 remain the same as in FIG. 1B the following performance results are obtained as provided in Table 2. As described herein, the various configurations to transfer data between points of a computer system are referred to as transmission structures, which as described herein include microstrips, striplines, image lines, thin lines, inverted microstrips, slot lines, trap inverted microstrips, coplanar waveguides (CPW), coplanar strip (CPS), striplines and the like.

As illustrated in Table 1, the microstrip 100 of FIG. 1A offers useful coupling coefficients ($K_C$). Unfortunately, the output pulse width is significantly limited by its physical length and the low effective dielectric constant achieved in the microstrip transmission structure 100. In contrast, an equivalent stripline transmission structure offers larger coupling coefficients, greater pulse width and better directivity as illustrated in Table 2. Unfortunately, conventional stripline transmission structures require the use of an inner metal which is incompatible with a four layer printed circuit board stack up.

Accordingly, one embodiment of the present invention provides an electromagnetic coupler for use in signaling schemes to transfer energy in the form of digital data between multiple devices while minimizing the transmission line reflections and consequent inter-symbol interference that results form coupling energy transfer. One embodiment of the invention describes a meander line coupler to enable reconstruction of a data signal transmitted along a signal line in accordance with one embodiment, for example, as depicted with reference to FIGS. 2A and 2B.

Previous methods have discussed the possibility of using the folding inherent in serpentine stripline structures as a method for fitting a quarter wavelength directional coupler into a smaller physical length. Unfortunately, the prior techniques fail to identify a limitation in the performance of meander line transmission structures, especially when the input signal is a time domain pulse. In addition, preferred implementations of the previous techniques were found where the folded physical length of the transmission structure permits the distance between adjacent meanders (L) 252 to be many times the conductor width, for example, as illustrated with reference to FIG. 2B.

Under these conditions, the previous techniques have identified that there is little or no coupling between adjacent meander segments and the transmission structure behaves identically to a coupler whose electrical length is equal to the length of the straightened meander curves. Likewise, previous techniques have identified that under these conditions, the directivity of the transmission structure is unaffected by the fold. However, if the dimension 252 (L) is small, such as for example, 2–5 times the conductor width and 2–5 times the dielectric thickness, then appreciable coupling occurs between adjacent meander sections in the stripline transmission structure case. While the capacitive coupling coefficient is usefully increased, the consequent reduction in the inductive coupling coefficients results in a significant reduction in the coupler directivity.

Figure 2A:
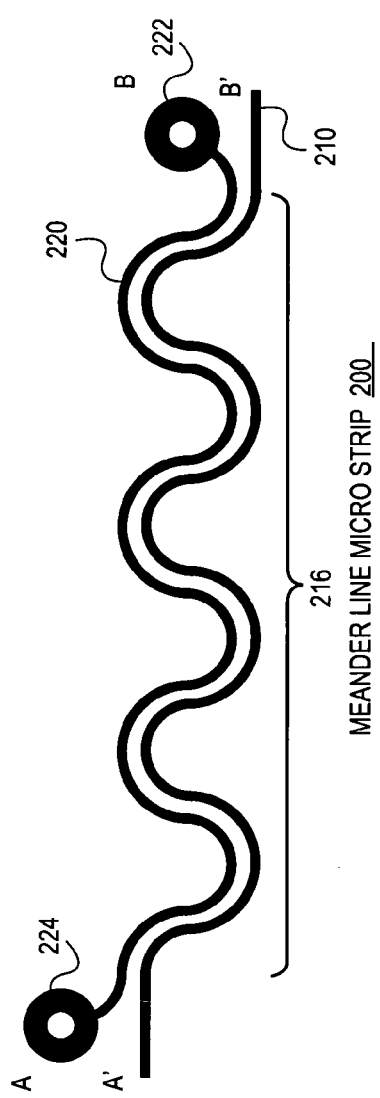
FIGS. 2A and 2B depict block diagrams illustrating a meander line coupler, in accordance with one embodiment of the invention.
Figure 2B:
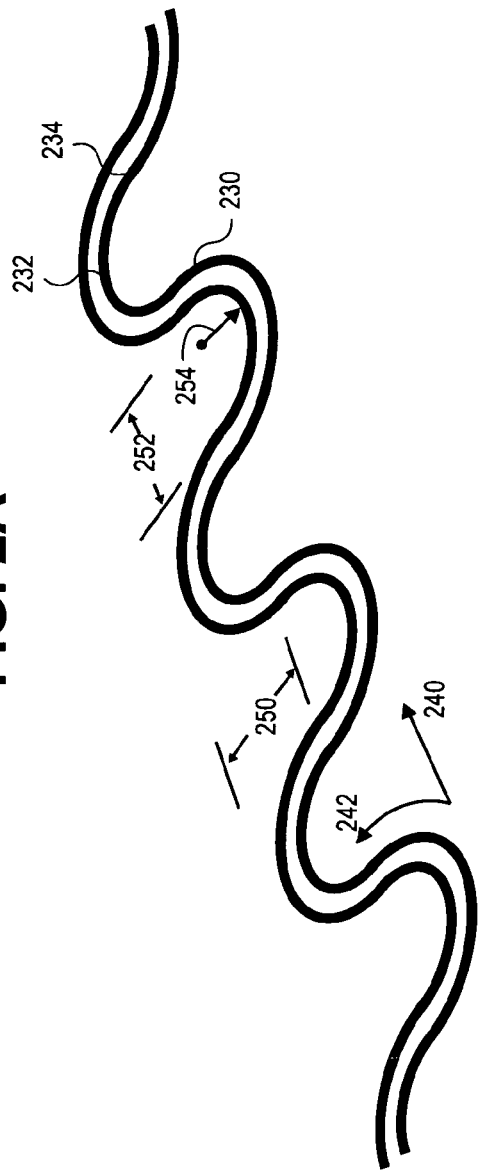

Further, when the dimension L 252 is relatively small, propagation occurs in both the longitudinal and transverse directions 242 ($V_l$) and 240 ($V_t$), whereas if (L) 252 is relatively large, the power transferred in the transverse mode is insignificant (FIG. 2B). However, the presence of dual propagation modes are important if the transmission structure is to be used for the transmission of digital pulses where the group velocity is critical. In particular, to minimize pulse distortion, it is necessary to control the propagation time difference between the longitudinal and transverse propagation modes.

Accordingly, the propagation time constant may be defined as follows:

$$T \text{ (longitudinal)}_{ABC} - T \text{ (transverse)}_{AC} \ll T_t \qquad (1)$$

where $T$ (longitudinal)$_{ABC}$ is the propagation time for the longitudinal mode over the path 230(A), 232(B) and 234(C)

(ABC), T (transverse)$_{AC}$ is the propagation delay for the transverse propagation mode over the path 230(A) to 234(C) (AC) and T$_r$ is pulse rise/fall time. Therefore, the constraint provided in Equation (1) results in an effective limitation on the ratio of the dimensions of W 250 and L 252 for any given pulse rise time. As such, in order to comply with Equation (1), one embodiment of the present invention provides meander line coupler 200, as depicted in FIG. 2A.

As illustrated in FIG. 2A, in one embodiment, coupler 200 is formed by replacing the simple linear elements of a conventional transmission structure, for example, as depicted in FIG. 1, with a meandered slow wave transmission structure. As illustrated, the distances between the terminal AB and A'B' are the same as those of the linear coupler in FIG. 1. Likewise, the same conductors and dielectric widths, thicknesses and materials of linear coupler 100 illustrated in FIG. 1 are used to form the meander line coupler 200 of FIGS. 2A and 2B. However, the lines of the meander line coupler 200 are folded to achieve an inner radius 254 (FIG. 2B) for the serpentine shape of 2 mils which gives the tightest radius that current volume printed circuit board (PCB) production allows. As a result, the divergence between the longitudinal and transverse propagation delays (see Equation (1)) is constrained.

signal line, which includes non-linear portion 216. Positioned proximate to the portion 216 of first transmission structure 210 is second transmission structure (coupled line) 220, which has the same geometry as first transmission structure 210 to form meander line coupler 200.

In one embodiment, second transmission structure 220 includes pads and 224 and 222, at points A and B respectively. In one embodiment, the pads at points A and B are used to connect to, for example, a conventional daughter card connector. Accordingly, utilizing a meander line coupler 200 as depicted in FIG. 2A, a signal transmitted along first transmission structure 210 is reconstructed and provided to/from the daughter card. In other words, the positioning of second transmission structure 220 forms a coupler with the portion of first transmission structure 210 to enable signal detection.

For example, transmission of a square wave pulse along first transmission structure 210 causes the formation of a triangular wave pulse along second transmission structure 220 having a polarity equal to the square wave transmitted along first transmission structure 210. Using the polarity of the various peaks created in second transmission structure 220, timing and direction of the logical state transitions on line 210 may be determined. As a result, using the timing

TABLE 3

| K$_C$ Capacitive coupling coefficient | K$_L$ Inductive coupling coefficient | Pulse V$_{out}$ (peak) in volts | Pulse width (V$_{out}$/2) in sec | Voltage x time product (volt sec) | Directivity (V$_{near}$/V$_{far}$) |
|---|---|---|---|---|---|
| 0.1214 | 0.117 | 0.1364 | 1.15E−10 | 1.54E−11 | 15.9 |

As such, using a microstrip meander line coupler as depicted in FIG. 2A, the following comparative performance results are achieved as illustrated in Table 3. Comparison of the performance data for the coupler shows that the folding of the meander line transmission structures of coupler 200 usefully increase the coupling coefficient K$_c$ value, since the curvature of the line results in an increase in the effective mutual capacitance between the couplers. Correspondingly, the inductive coupling coefficient value K$_L$ is reduced since the coupling between adjacent loops along the coupler length decreases the mutual inductance and the effective capacitive coupling coefficient is increased.

In one embodiment, for a surface microstrip meander line coupler, this improvement in the equalization of the K$_C$ and K$_L$ values has the useful effect of significantly improving the transmission structure directivity. This, in turn, results in an improvement in bus power efficiency, when used for coupling signals, since less energy is wasted in the coupler far end terminator. Also, as illustrated, there is useful improvement in the voltage time product that the meander line coupler provides compared to a linear coupler with the same interterminal distance A–B, A'–B'. By increasing the voltage time product of the coupled pulse, the meander coupler reduces the performance requirements of the associated receiver.

As such, FIG. 2A illustrates a printed circuit implementation of the meander line coupler 200. Accordingly, meander line coupler 200, as depicted in FIG. 2A, includes a first transmission structure (signal transmission line) 210 which includes a portion 216 having a geometry. In the embodiment illustrated, the geometry is a serpentine or meander line geometry. As such, in the embodiment illustrated, first transmission structure 210 is, for example, a mother board and the polarity of detected peaks, the signal transmitted along first transmission structure 210 may be reconstructed. Once reconstructed, the signal can be provided to attached devices via connectors, such as for example, daughter cards.

Furthermore, in the embodiments described, connection of a daughter card to the pads of the second transmission structure (couple line) 220 does not introduce electrical parasitics into first transmission structure 210, which may be, for example, a main bus line signal. By coupling the daughter card to the pads of second transmission structure 220, any electrical disturbance introduced by the connector pins is localized to the daughter card signal and has a minor impact on the signal integrity performance of the overall bus. In one embodiment, meander line coupler 200, as depicted in FIGS. 2A and 2B, may be utilized within differential signal lines.

As known to those skilled in the art, differential signaling refers to a technique where a binary signal can be sent differentially over a pair of conductors by driving one conductor with a signal and a second conductor with the logical complement of the signal. Unfortunately, differential signaling requires more pins and wires than single ended signaling. However, in return for the increased pin count, differential signaling offers several advantages, such as the ability to cancel several noise sources by making them appear as common mode noise to the differential receiver, providing a signal swing which gives twice the noise margin, providing a return current which is essentially a constant direct, current (DC) value, and reducing self-induced power supply noise.

Figure 3A:
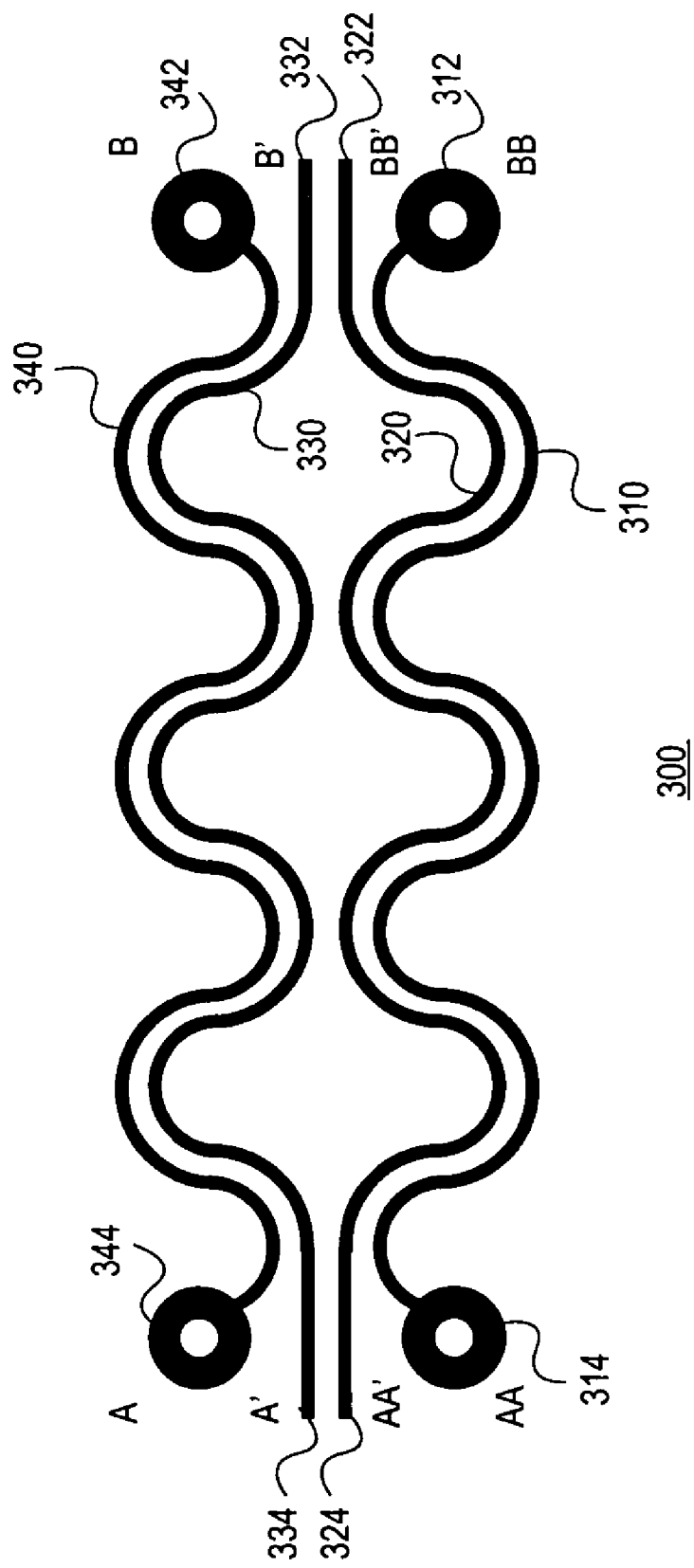
FIGS. 3A and 3B are block diagrams illustrating a differential signal meander line coupler, in accordance with a further embodiment of the invention.
Figure 3B:
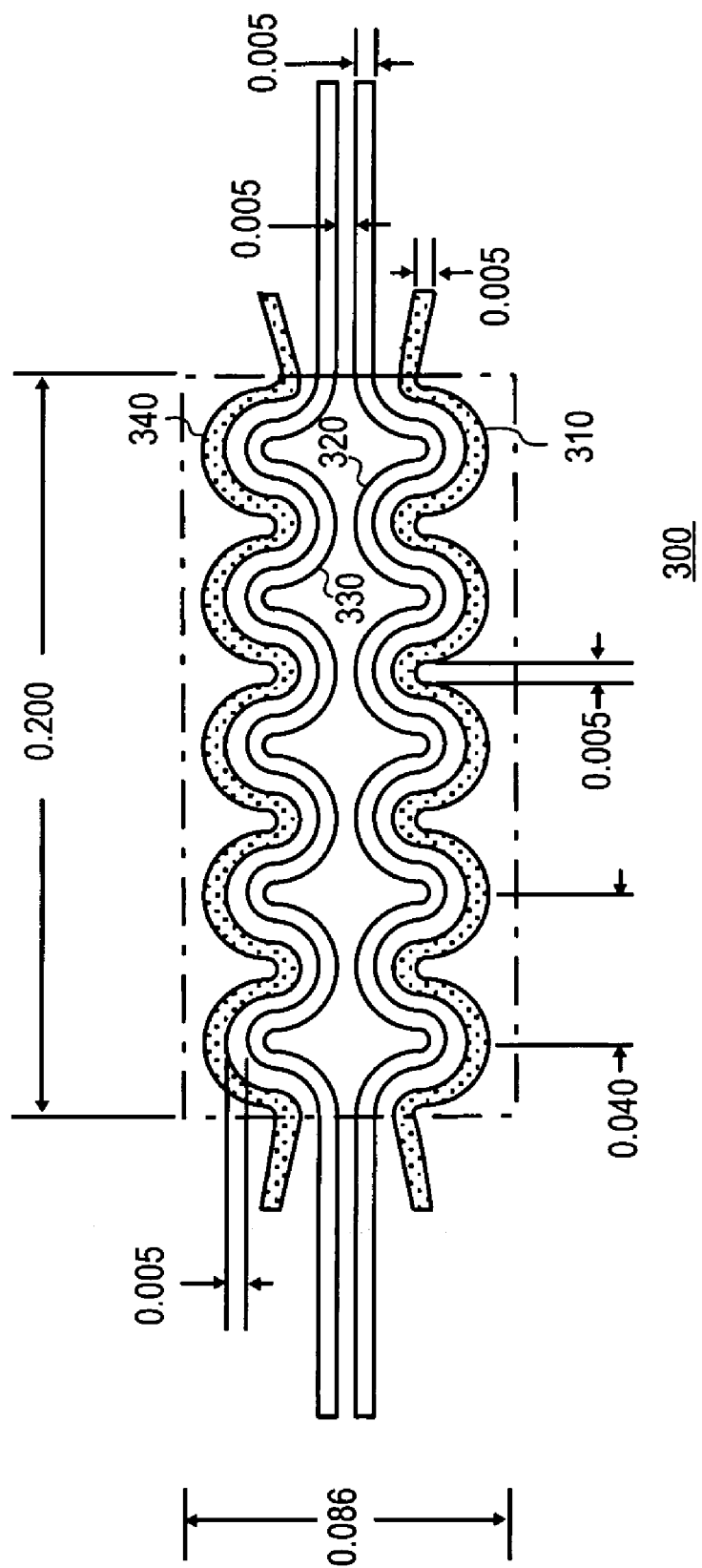

Accordingly, FIG. 3A or 3B shows a differential meander line coupler 300 comprised of bus signal lines (first transmission structure) 330 (A'–B') and 320 (AA'–BB') along with coupled lines (second transmission structure) 340 (A–B) and 310 (AA–BB). For example, in a multipoint bus implementation embodiment, line 320 and line 330 form part of a mother board bus line and connect serially to other couplers on the signal line. Furthermore, coupled line 310 and coupled line 340 may be connected to a daughter card through a hole connector at the pads 312, 314, 342 and 344. Alternatively, pads 312, 314, 342 and 344 may be reshaped to permit the use of a surface-mount connector to provide the connection to the daughter card.

In other words, as compared to FIG. 2A, FIG. 3A or 3B includes the first transmission structure (320 and 330) as a differential signal line. Along the differential signal line, a portion having a geometry is provided. Within the portion having the geometry, the differential signal lines mirror one another according to their serpentine or meander line geometry. Likewise, the second transmission structure is comprised of coupled lines (310 and 340) formed outside the mirrored portions of the first transmission structure. As such, the serpentine or meander line coupler described herein may be adapted to detect signals transmitted along differential bus signal lines by providing the coupled lines as the second transmission structure (310 and 340) to enable reconstruction of the logical state and timing of a differential signal transmitted along the differential signal lines.

Fabrication of a differential meander line coupler 300, as depicted in FIG. 3A, may be performed assuming the PCB manufacturing process places a 5 mil/5 mil limitation on the line width and line spacing. In one embodiment, a meander line coupler similar to coupler 300 as depicted in FIG. 3B may be formed with five meander sections versus the three shown in FIG. 3A, while conforming in size for placement in a 196 mil×90 mil (5 mm×2 mm) foot point which is compatible with a 100 mil×100 mil connector pin-out grid with a single removed pin row.

In one embodiment, implementation of either a differential meander line coupler or a meander line coupler for a single bus line may be provided while allowing some latitude in the required directivity performance obtained from the coupler. In one embodiment, if the coupler is designed to provide a lower reflection coefficient at the bus signal interfaces, then obtaining good directivity performance from the meander line coupler is not essential to successful bus operation. For example, the width of conductors may be slightly increased as they extend out beyond the points 334 (A'), point 324 (AA'), point 332 (B') and point 322 (BB').

In one embodiment, the increase of the conductor widths is performed so that impedance of the conductor along the lengths 320 and 330 matches the impedance beyond the aforementioned points, When the additional loading due to coupled conductors 310 and 340 is taken into account. In an alternative embodiment, it is possible to relax the tolerance with which these conductor impedances are matched and use a coupler transmission structure designed with high directivity to minimize the extent to which increased reflections influence the wave form seen at the coupled load ports.

FIG. 3B illustrates one embodiment for implementation of the differential meander line coupler 300, as depicted in FIG. 3A, including bus signal lines (first transmission structure) 330 (A'–B') and 320 (AA'–BB') along with coupled lines (second transmission structure) 340 (A–B) and 310 (AA–BB). In the embodiment illustrated, the various size configurations are provided in inches. Representatively, an interline separation (S) between coupled line 340 and transmission line 330 is 0.005 inches. Likewise, an interline separation (S) between transmission lines 320 and 330 are shown as 0.005 inches. As further illustrated, a line width of transmission line 320 and coupled line 310 is shown as 0.005 inches.

As further illustrated, a distance between adjacent meanders (L) is shown as 0.005 inches, whereas a distance between non-adjacent meanders is shown as 0.040 inches. Based on such configuration, the meander line coupler 300 provides a meander line coupler width of 0.086 inches and a meander line coupler length of 0.2 inches. According, based on the illustrated configurations of the meander line coupler, the meander line has a footprint to enable coupling of, for example, a daughter card under the footprint of a standard card connector, such as, for example, a a double data rate (DDR) or (RIMM) connector used for memory modules.

Figure 4:
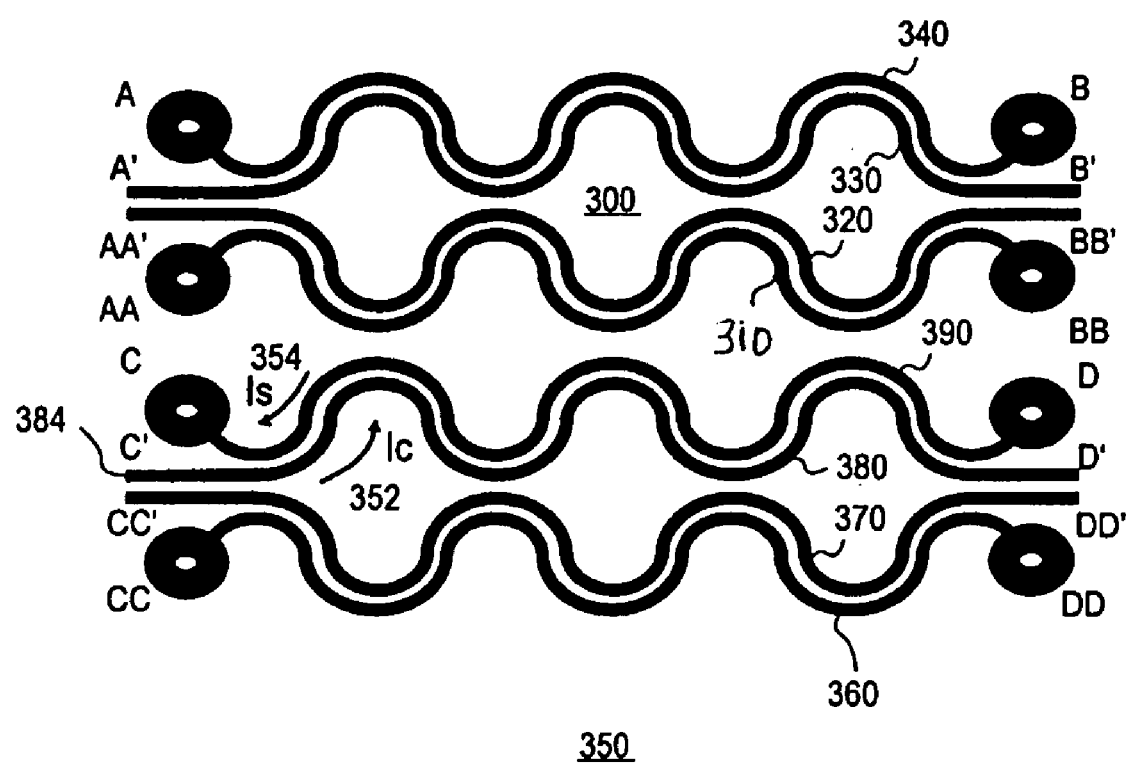
FIG. 4 depicts one embodiment for formation of parallel differential signal meander line coupler, in accordance with a further embodiment of the invention.

In one embodiment, a differential meander line coupler 300, as described with reference to FIG. 3A may be formed in parallel with additional differential meander line couplers 350; for example, comprised of paired conductor lengths (C'–D') 380, (CC'–DD–) 360, (C'–D') 390 and (CC'–DD') 370, as depicted with reference to FIG. 4. As depicted in FIG. 4, the symmetry in the paired conductor lengths (A'–B') 330 and (AA'–BB') 320 and (A'–B') 340 and (AA–BB) 310 is used to minimize the propagation skew time between the conductors comprising the differential pairs and permits bus signal lines 320 and 330 to be placed adjacent and relatively well coupled to reduce the potential for interline crosstalk and radiation.

Further, as illustrated with reference to FIG. 4, the current ($I_S$) 352 induced by signal arriving at point C'384 results in a coupled current 354 ($I_C$) which according to Lenz'law is in the reverse sense to the current $I_S$ and scaled by the inductive crosstalk coefficient. Therefore, the resulting magnetic field coupling to conductors at points AA and AA' is reduced by a factor of $(1-K_L)$ compared to a meander line structure where the lines 370 and 380 are routed on the outside of coupled lines 360 and 390. By similar considerations, the electric field coupling is reduced by a factor of $1-K_c$. As such, in one embodiment, this differential transmission structures shown in FIGS. 3A and 3B and 4 are therefore considered superior to other possible configurations.

Figure 5A:
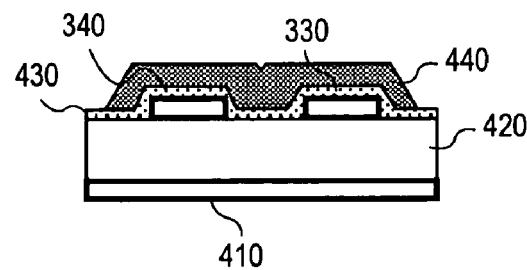
FIGS. 5A and 5B are block diagrams illustrating formation of a differential meander line coupler, in accordance with one embodiment of the invention.
Figure 5B:
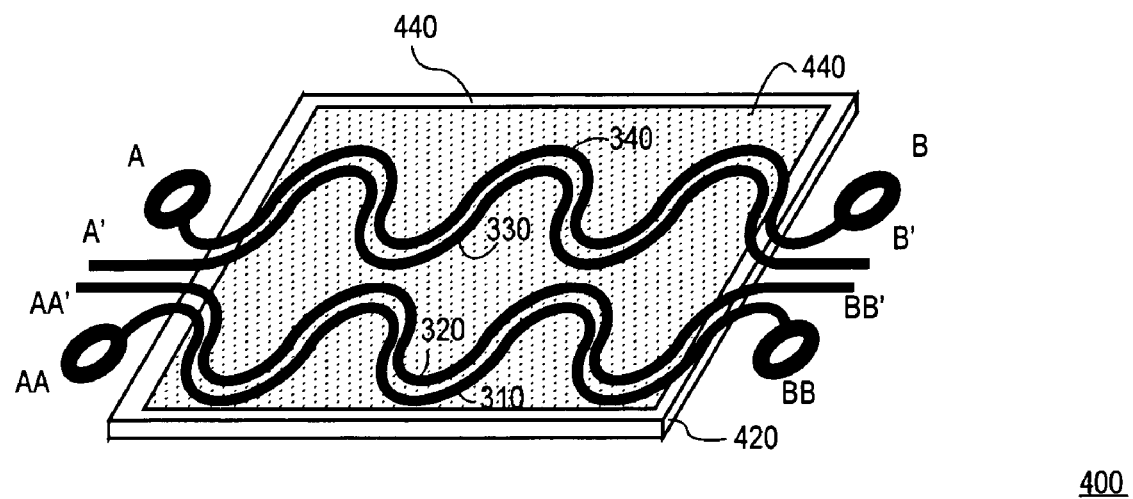

FIGS. 5A and 5B illustrate one embodiment for fabrication of a differential meander line coupler 400 in accordance with one embodiment of the invention. As illustrated, the differential meander line coupler 300, as depicted in FIGS. 3A and 3B, including paired conductor lengths (A'–B') 330 and (AA'–BB') 320 and (A–B) 340 and (AA–BB) 310, is fabricated onto a dielectric 420 as depicted in FIG. 5B. The dielectric includes ground plane 410. In one embodiment, the various transmission structures of coupler 400 are fabricated onto dielectric 420, such as via fabrication of the lines as copper traces. In other words, the differential signal lines 320 and 330, which are generally formed as linear traces along a motherboard are replaced with a portion having a serpentine or meander line geometry.

In one embodiment, proximate these meander line geometries are formed conductive traces as coupled lines 310 and 340, as depicted in FIG. 5B, which include pads at their near and far end portions. Once the transmission structures of coupler 400 are formed on dielectric 420, dielectric 420 may be coated with a protective layer of solder mask 430 (FIG. 5A). In one embodiment, solder mask 430 is comprised of an epoxy or similar material and may have a thickness between 0.2 and 4 mils. In one embodiment, the design of coupler 400 is improved by the solder mask 430. In addition, in a further embodiment, it is also possible to add an additional silk screened applique patch 440 of material to enhance coupling within coupler 400, as illustrated in FIGS. 5A and 5B.

In one embodiment, the material used to form patch 440 is comprised of a suitable dielectric, such as epoxy, or may be a composite material, such as an epoxy loaded with ferrite powder or an epoxy loaded with titanium dioxide or other similar materials which are used to enhance the dielectric constant and permeability of the coupler region. In one embodiment, a thickness of an epoxy applique patch of, for example, 0.7 millimeters, with a dielectric constant (ER) =3.8 when applied to the differential transmission structure 400 increases the capacitive coupling coefficient by approximately 17 percent.

Figure 6:
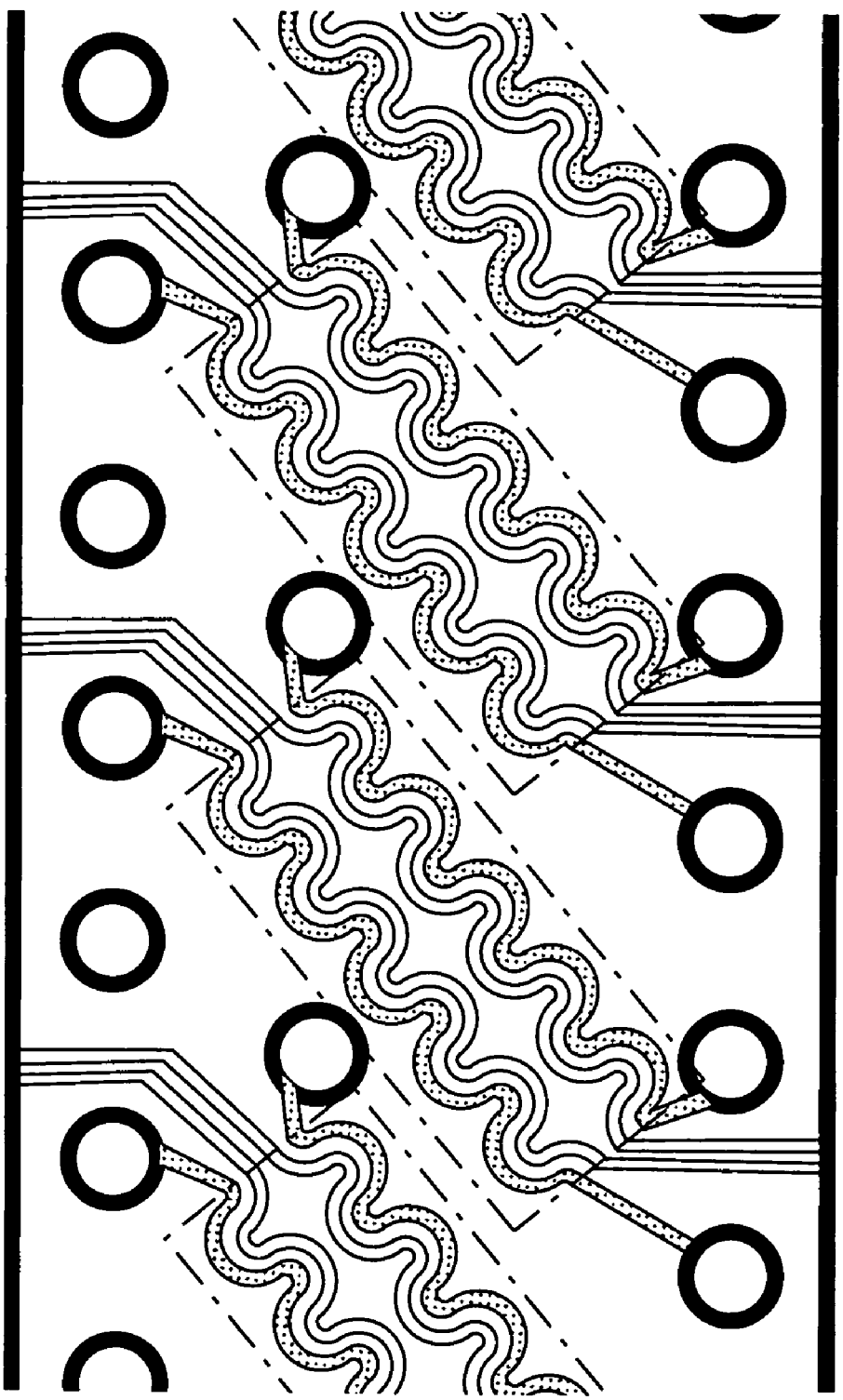
FIG. 6 is a block diagram illustrating fabrication of adjacent meander line coupler, in accordance with one embodiment of the invention.

FIG. 6 illustrates one embodiment for layout placement of transmission structures of a coupler having a serpentine or meander line geometry using, for example, a through hole connector pin field 500. Placement of the transmission structures is performed in a diagonal rather than perpendicular direction in relation to the through hole connector pin field. The diagonal placement is facilitated by depopulating some of the connector pins to allow the transmission structures to fit under the footprint of a card connector. However, in the design depicted in FIG. 6, further revisions may be required to equalize the connector lengths of the coupled conductors. As such, utilizing the embodiment as depicted in FIG. 6, a surface mounted connector may be similarly utilized with a beneficial reduction in the associated electrical parasitics.

Figure 7:
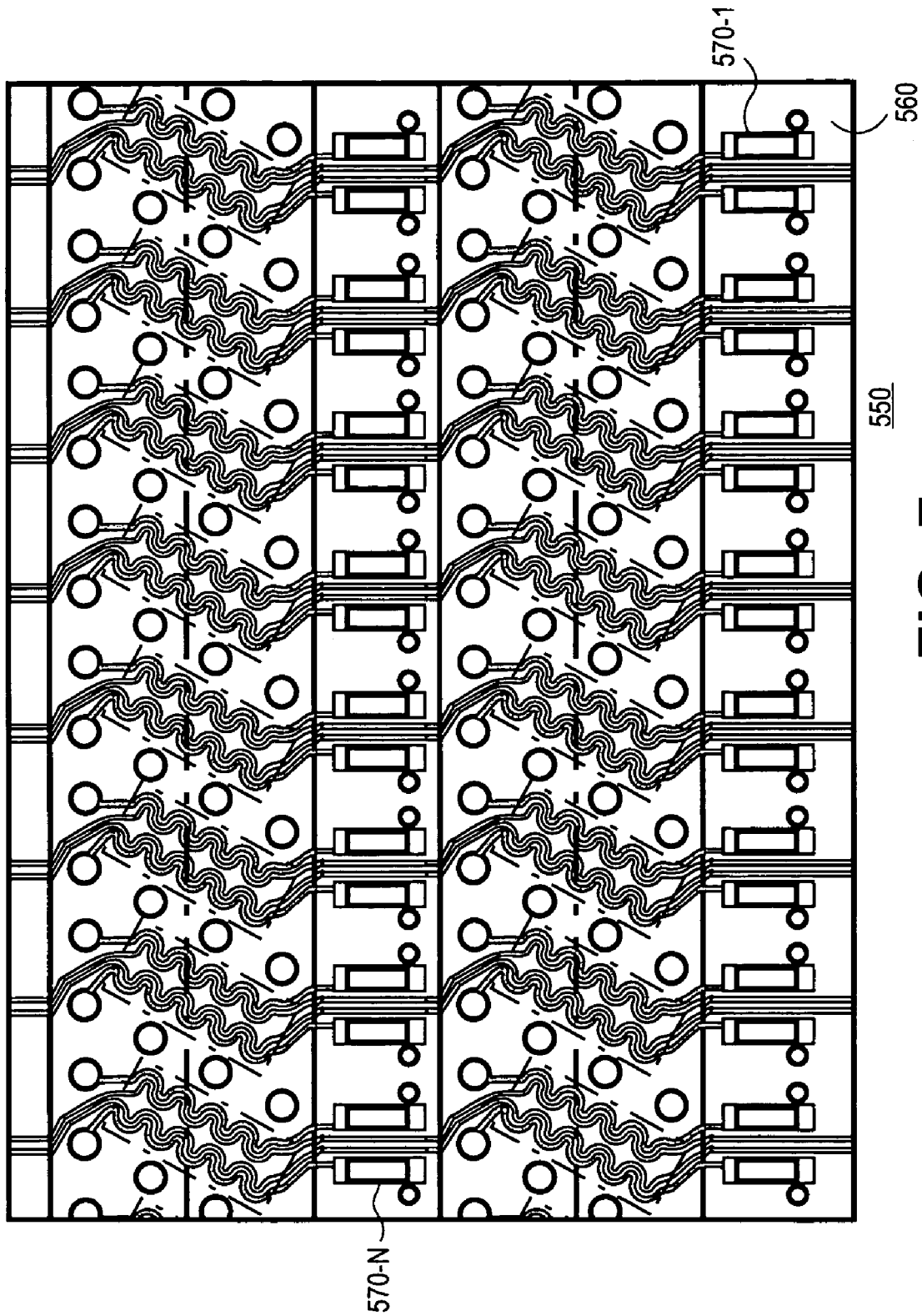
FIG. 7 is a block diagram illustrating meander line coupler within a multidrop terminated in accordance with a further embodiment of the invention.

FIG. 7 illustrates an alternative multidrop implementation 550 where the number of conductor pins required for the coupling scheme is reduced. As illustrated, the couplers are arranged sequentially and in series down a signal line. Although multiple loads are placed on the signal line as a result of the couplers' interpretation of a signal transmitted on the signal line is performed without corrupting the signal using the meander line couplers described herein. In the embodiments previously depicted, both the far end of coupled lines 310 and 340 (points 312, 322, 332 and 342) (FIG. 3A and the near end points of coupled lines 310 and 340 (points 314, 324, 334 and 344) are connected to, for example, a daughter card via the connector or pads. As a result, the far end voltage produced by the coupler is terminated with the termination network or resistor placed on the daughter card.

In contrast, in the embodiments shown in FIG. 7, the far end voltage from each bank of couplers is terminated with, for example, a resistor mounted on the motherboard 560. In one embodiment, the termination resistors 570-1, . . . , 570-N are referenced to a logic reference voltage supplied by the daughter card. As a result, the number of pins required for coupling to the daughter card is reduced by almost one-half and allows the free pins to be used for other purposes, such as power or ground distribution.

In other words, as illustrated with reference to FIG. 7, couplers comprised of transmission structures having the predetermined serpentine or meander line geometries are terminated using, for example, surface mount resistor terminations, which may be terminated to round or an appropriate reference voltage. As such, in the embodiment illustrated, an 8-bit bus includes various meander line couplers in accordance with embodiments of the invention, along the same bus signal line, while minimizing transmission line reflections and consequent inter-symbol interference, which generally occurs from coupling in the form of crosstalk.

TABLE 4

| Case | Line width (mils) | Line Separation (mils) | Metal Thickness (mils) | Dielectric Thickness (mils) | Dielectric Constant ($E_r$) |
|---|---|---|---|---|---|
| Nominal | 5.0 | 5.0 | 2.0 | 4.0 | 4.3 |
| Strongest | 5.5 | 4.5 | 2.3 | 4.3 | 3.8 |
| Weakest | 4.5 | 5.5 | 1.7 | 3.7 | 4.8 |

TABLE 5

| Case | $K_c$ Capacitive coupling coefficient | $K_L$ Inductive coupling coefficient | Pulse $V_{out}$ (peak) in volts | Pulse width ($V_{out}/2$) in sec | Voltage x time product (volt sec) | Directivity ($V_{near}/V_{far}$) |
|---|---|---|---|---|---|---|
| Nominal | 0.1214 | 0.117 | 0.1364 | 1.15E−10 | 1.54E−11 | 15.9 |
| Strongest | 0.1658 | 0.1405 | 0.1488 | 1.11E−10 | 1.57E−11 | 11.56 |
| Weakest | 0.0981 | 0.107 | 0.1212 | 1.23E−10 | 1.42e−11 | 11.43 |

The performance of the meander line couplers as described in the embodiments herein are relatively stable with variations in the conductor width, thickness and variations in dielectric thickness and dielectric constant due to the relatively equal $K_C$ and $K_L$ values. For example, in one embodiment, tabulation of the mechanical properties of the nominal strongest and weakest coupling cases are illustrated in Table 4. As such, based on the coupling cases provided in Table 4, the computed electrical performance variation for each of the coupling cases is provided with reference to Table 5.

As illustrated, a stripline version of the meander line coupler including transmission structure having the geometry has similar useful propagation characteristics assuming that the reduction in directivity and consequent slight loss in bus power transfer efficiency is acceptable. Accordingly, the single-ended line and differential meander line coupler described herein may be incorporated within meander line microstrip transmission structures, as well as meander line stripline transmission structures.

FIG. 8 illustrates a block diagram of computer system 600 including, for example, a meander line microstrip coupler, a meander line stripline coupler, or other like transmission structure, in accordance with embodiments of the invention. As illustrated, a motherboard 602 includes differential bus signal lines 610, 620 and 630. During the formation of the differential signal lines, a portion of the differential signal lines is selected and replaced or initially fabricated according to a geometry. In the embodiments depicted, the geometry is a meander or serpentine geometry.

As to the serpentine geometric portion, a second transmission structure is provided, which is comprised of coupled lines 612, 614, 622, 624, 632 and 634, which are positioned proximate the portions of the differential bus lines have the geometry. As illustrated, the coupled line include pads at their near and far end portions, which enable coupling of a connector 640 and daughter card 650, which is inserted into the connector. As such, the meander line coupler enables digital pulse transmission and through hole or surface mount connector combination by having a size such that a small footprint (W) of the meander line coupler provides mechanical compatibility with connector dimensions of conventional connectors, such as daughter cards.

As such, coupler including transmission structures having a geometry in accordance with embodiments of the invention may be used within signaling schemes that make use of electromagnetic coupling structures to transfer energy in the form of signal data between multiple devices while minimizing the transmission line reflections and consequent inter-symbol interference that results from this energy transfer. The coupler described herein meet several electrical constraints to be used within such signaling schemes. The coupler transmission structures described provide coupling between conductors which is sufficient to ensure that signal amplitude transferred is sufficient to be reliably recognized by a receiving device.

In addition, the width of a coupled pulse within such coupler is sufficient to allow a receiver to fully respond to the input signal and reconstruct the input signal. Likewise, the coupler transmission structures described herein exhibit useful directivity performance over data bandwidth. Furthermore, the coupler transmission structures described herein are compatible with four layer metal/dielectric stack-ups used in low cost personal computer motherboards. Accordingly, the meander line coupler described herein may be embodied within either a microstrip or stripline coupler transmission structure having a geometry that permits a minimum coupled length requirement to be met while using a compact, space-efficient form factor in providing additional benefits in the terms of the enhanced directivity of the coupler structure.

In the embodiments described, the coupler transmission structures described are configured to fit within the space available under the footprint of a standard daughter card connector of, for example, a DDR or a RAM connector used for memory modules. Although the pins on these connectors are typically placed on a 0.1 inch "rectangular grid with two grids being overlapped so that the effective distance between pins is 0.05" inches, the configurations of coupler transmission structures described, for example, as depicted in FIG. 3B, allow placement under the footprints of conventional connectors. In other words, the transmission structure couplers described, fit under a connector with the small footprint of typically 5 millimeters×2 millimeters (196 mil×90 mil) with the appropriate orientation of the coupler and removal of unnecessary connector pins. The coupler can be used to transfer signals to a daughter card via the integral connector.

Alternate Embodiments

Several aspects of one implementation of the transmission structure for providing reconstruction of a signal transmitted on a coupled bus line have been described. However, various implementations of the transmission structure provide numerous features including, complementing, supplementing, and/or replacing the features described above. Features can be implemented as part of a memory or as part of any I/O or hardware bus in different embodiment implementations. In addition, the foregoing description, for purposes of explanation, used specific nomenclature to provide a thorough understanding of the embodiments of the invention. However, it will be apparent to one skilled in the art that the specific details are not required in order to practice the embodiments of the invention.

In addition, although an embodiment described herein is directed to a transmission structure, it will be appreciated by those skilled in the art that the embodiments of the present invention can be applied to other systems. In fact, systems for multidrop buses using the described transmission structure fall within the embodiments of the present invention, as defined by the appended claims. The embodiments described above were chosen and described in order to best explain the principles of the embodiments of the invention and its practical applications. These embodiments were chosen to thereby enable others skilled in the art to best utilize the invention and various embodiments with various modifications as are suited to the particular use contemplated.

It is to be understood that even though numerous characteristics and advantages of various embodiments of the present invention have been set forth in the foregoing description, together with details of the structure and function of various embodiments of the invention, this disclosure is illustrative only. In some cases, certain subassemblies are only described in detail with one such embodiment. Nevertheless, it is recognized and intended that such subassemblies may be used in other embodiments of the invention. Changes may be made in detail, especially matters of structure and management of parts within the principles of the embodiments of the invention to the full extent indicated by the broad general meaning of the terms in which the appended claims are expressed.

Having disclosed exemplary embodiments and the best mode, modifications and variations may be made to the disclosed embodiments while remaining within the scope of the embodiments of the invention as defined by the following claims.

What is claimed is:

1. An apparatus, comprising:
    a first transmission structure including a portion having a non-linear geometry; and
    a second transmission structure having the non-linear geometry and aligned along and positioned proximate to the portion of the first transmission structure having the non-linear geometry to form an electromagnetic coupler with the portion of the first transmission structure, wherein a geometry of the electromagnetic coupler is configured to enable placement within a footprint of a card connector.

2. The apparatus of claim 1, wherein the first transmission structure is a bus signal transmission line.

3. The apparatus of claim 1, wherein the geometry of the electromagnetic coupler is a serpentine geometry.

4. The apparatus of claim 1, wherein the second transmission structure and the portion of the first transmission structure comprise a meander line microstrip coupler.

5. The apparatus of claim 1, wherein the second transmission structure and the portion of the first transmission structure comprise a meander line stripline coupler.

6. The apparatus of claim 1, wherein the second transmission structure comprises:
    a first pad coupled to a far end of the second transmission structure; and
    a second pad coupled to a near end of the second transmission structure.

7. The apparatus of claim 1, wherein the second transmission structure comprises:

a pad coupled to a near end of the second transmission structure; and a termination resistor coupled to a far end of the second transmission structure.

8. The apparatus of claim 1, wherein the first transmission structure comprises a differential signal pair, each differential signal pair including a portion having the non-linear geometry such that the portions of the differential signal pairs having the non-linear geometry mirror one another.

9. The apparatus of claim 8, wherein the second transmission structure comprises coupled lines arranged outside the mirrored portions of the differential signal pair.

10. The apparatus of claim 1, further comprising a daughter card connector coupled to pads at a near end and a far end of the second transmission structure.

11. An apparatus comprising:

a circuit board;

a first conductive trace on the circuit board, the first conductive trace including a portion having a non-linear geometry; and a second conductive trace having the non-linear geometry and aligned along and positioned proximate to the portion of the first conductive trace to form an electromagnetic coupler with the portion of the first conductive trace, wherein a geometry of the electromagnetic coupler is configured to enable placement within a footprint of a card connector.

12. The apparatus of claim 11, further comprising:

a dielectric mask arranged over the conductive traces and the circuit board; and a dielectric patch arranged over the first and second conductive traces.

13. The apparatus of claim 12, wherein the dielectric mask is a solder mask comprised of epoxy.

14. The apparatus of claim 12, wherein the dielectric patch is a silk screened applique patch to enhance coupling between the first and second conductive traces.

15. The apparatus of claim 11, wherein the geometry of the electromagnetic coupler is a serpentine geometry.

16. The apparatus of claim 11, wherein the second conductive trace and the portion of the first conductive trace comprise one of a meander line microstrip coupler and a meander line stripline coupler.

17. The apparatus of claim 11, wherein the second conductive trace comprises:

a pad coupled to a near end of the second conductive trace; and a termination resistor coupled to a far end of the second conductive trace.

18. The apparatus of claim 11, wherein the first conductive trace comprises a differential conductive trace pair, each differential conductive trace pair including a portion having the non-linear geometry such that the portions of the differential conductive trace pairs having the non-linear geometry mirror one another.

19. The apparatus of claim 18, wherein the second transmission structure comprises coupled conductive traces arranged outside the mirrored portions of the differential conductive trace pair.

20. The apparatus of claim 11, further comprising a daughter card connector coupled to pads at a near end and a far end of the second conductive trace, and wherein the first conductive trace is a bus signal transmission line.

21. A system comprising:

a first transmission structure including a portion having a non-linear geometry;

a second transmission structure having the non-linear geometry and aligned along and positioned proximate to the portion of the first transmission structure to form an electromagnetic coupler with the first transmission structure, wherein a geometry of the electromagnetic coupler is configured to enable placement within a footprint of a card connector;

the card connector coupled to at least one pad of the second transmission structure to receive a reconstructed signal; and a memory card coupled to the card connector.

22. The system of claim 21, wherein the first transmission structure is a bus signal transmission line.

23. The system of claim 21, wherein the geometry of the electromagnetic coupler is a serpentine geometry.

24. The system of claim 21, wherein the second transmission structure and the portion of the first transmission structure comprise a meander line microstrip coupler.

25. The system of claim 21, wherein the second transmission structure and the portion of the first transmission structure comprise a meander line stripline coupler.

26. The system of claim 21, wherein the second transmission structure comprises:

a first pad coupled to a far end of the second transmission structure; and a second pad coupled to a near end of the second transmission structure.

27. The system of claim 21, wherein the second transmission line structure comprises:

a pad coupled to a near end of the second transmission line structure; and a termination resistor coupled to a far end of the second transmission structure.

28. The system of claim 21, wherein the first transmission structure comprises a differential signal pair, each differential signal pair including a portion having the non-linear geometry such that the portions of the differential signal pairs having the non-linear geometry mirror one another.

29. The system of claim 28, wherein the second transmission structure comprises coupled lines formed outside the mirrored portions of the differential signal pair.

30. The system of claim 21, wherein the card connector is a daughter card connector coupled to pads at a near end and a far end of the second transmission structure.

* * * * *

UNITED STATES PATENT AND TRADEMARK OFFICE
CERTIFICATE OF CORRECTION

PATENT NO.       : 7,002,430 B2
APPLICATION NO. : 10/449215
DATED            : February 21, 2006
INVENTOR(S)      : Benham et al.

It is certified that error appears in the above-identified patent and that said Letters Patent is hereby corrected as shown below:

In column 4, at line 64, delete "$T_t$" and insert --$T_r$--.
In column 6, at line 7, delete first occurrence of "and".
In column 7, at line 51, delete "When" and insert --when--.
In column 8, at line 13, delete second occurrence of "a".
In column 9, at line 53, after "(3A" insert --)--.

Signed and Sealed this

Twenty-seventh Day of November, 2007

JON W. DUDAS
*Director of the United States Patent and Trademark Office*